United States Patent
Yoon et al.

(10) Patent No.: US 9,798,659 B2
(45) Date of Patent: Oct. 24, 2017

(54) ADDRESS SCHEDULING METHODS FOR NON-VOLATILE MEMORY DEVICES WITH THREE-DIMENSIONAL MEMORY CELL ARRAYS

(71) Applicants: Chi Weon Yoon, Seoul (KR); Dong Hyuk Chae, Seoul (KR); Sang-Wan Nam, Hwaseong-si (KR); Jung-Yun Yun, Seoul (KR)

(72) Inventors: Chi Weon Yoon, Seoul (KR); Dong Hyuk Chae, Seoul (KR); Sang-Wan Nam, Hwaseong-si (KR); Jung-Yun Yun, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/837,857

(22) Filed: Aug. 27, 2015

(65) Prior Publication Data

US 2015/0370705 A1 Dec. 24, 2015

Related U.S. Application Data

(63) Continuation of application No. 13/213,806, filed on Aug. 19, 2011, now abandoned.

(30) Foreign Application Priority Data

Aug. 20, 2010 (KR) .................. 10-2010-0080964

(51) Int. Cl.
*G06F 12/06* (2006.01)
*G06F 3/06* (2006.01)
(Continued)

(52) U.S. Cl.
CPC ........ *G06F 12/0646* (2013.01); *G06F 3/0619* (2013.01); *G06F 3/0653* (2013.01);
(Continued)

(58) Field of Classification Search
CPC ... G11C 11/5628; G11C 11/5642; G11C 8/10; G11C 16/0483
See application file for complete search history.

(56) References Cited

U.S. PATENT DOCUMENTS 7,212,436 B2   5/2007 Li
7,623,375 B2  11/2009 Kim et al.
(Continued)

FOREIGN PATENT DOCUMENTS

JP   2008-103429 A   5/2008
JP    2008532199 A   8/2008
(Continued)

OTHER PUBLICATIONS

U.S. Office Action dated Sep. 11, 2015 for corresponding U.S. Appl. No. 13/213,806.

(Continued)

*Primary Examiner* — Gary W Cygiel
(74) *Attorney, Agent, or Firm* — Harness, Dickey & Pierce, P.L.C.

(57) ABSTRACT

At least one address scheduling method includes selecting a first bit line, selecting a first string connected to the first bit line, performing address scheduling on N pages of each of multi-level cells in the first string sequentially from a bottom word line to a top word line, and after completing the address scheduling on all word lines in the first string, performing address scheduling on second to k-th strings sequentially in the same manner as performed with respect to the first string, where "k" is 2 or a natural number greater than 2.

15 Claims, 14 Drawing Sheets

(51) Int. Cl.
*G11C 5/02* (2006.01)
*G11C 11/56* (2006.01)
*G11C 16/04* (2006.01)
*G11C 8/10* (2006.01)

(52) U.S. Cl.
CPC .......... *G06F 3/0679* (2013.01); *G11C 5/025* (2013.01); *G11C 8/10* (2013.01); *G11C 11/5628* (2013.01); *G11C 11/5642* (2013.01); *G06F 2212/2022* (2013.01); *G11C 16/0483* (2013.01)

(56) References Cited

U.S. PATENT DOCUMENTS

| | | | |
|---|---|---|---|
| 8,514,625 | B2 | 8/2013 | Shim et al. |
| 8,767,473 | B2 | 7/2014 | Shim et al. |
| 2006/0193176 | A1 | 8/2006 | Li |
| 2008/0212367 | A1 | 9/2008 | Kim et al. |
| 2008/0310230 | A1 | 12/2008 | Kim et al. |
| 2010/0097859 | A1* | 4/2010 | Shim ............ G11C 5/02 365/185.05 |
| 2010/0125695 | A1 | 5/2010 | Wu et al. |
| 2010/0181615 | A1 | 7/2010 | Ikebuchi |
| 2011/0024816 | A1* | 2/2011 | Moon et al. ............ 257/314 |

FOREIGN PATENT DOCUMENTS

| | | |
|---|---|---|
| JP | 2010040109 A | 2/2010 |
| KR | 100904352 | 11/2007 |
| KR | 100816154 B1 | 3/2008 |
| KR | 2008-0109335 A | 12/2008 |

OTHER PUBLICATIONS

Office Action for Corresponding Korea Patent Application No. 10-2010-0080964 dated on May 22, 2016.
Office Action for Corresponding Korean Patent Application No. 10-2010-0080964 issued on Apr. 26, 2017.

* cited by examiner

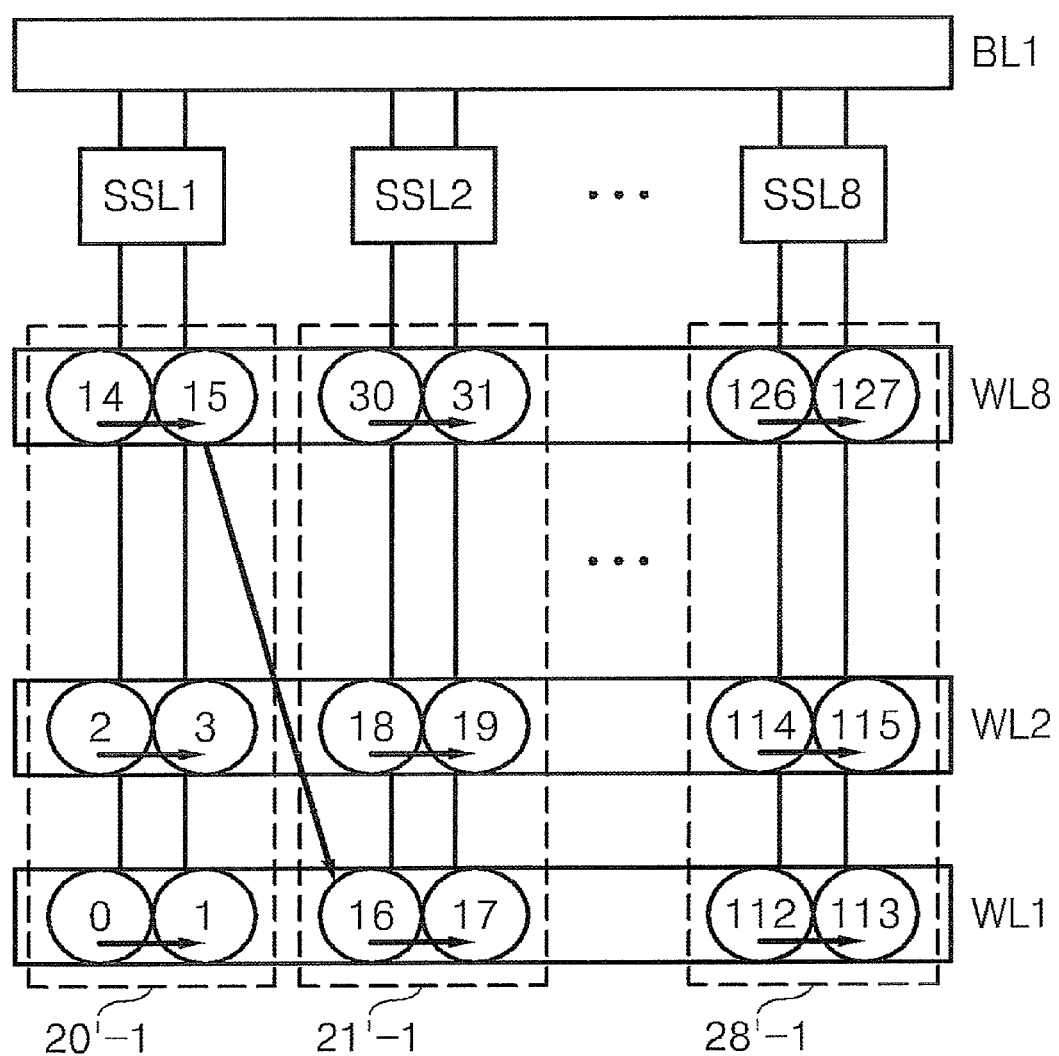

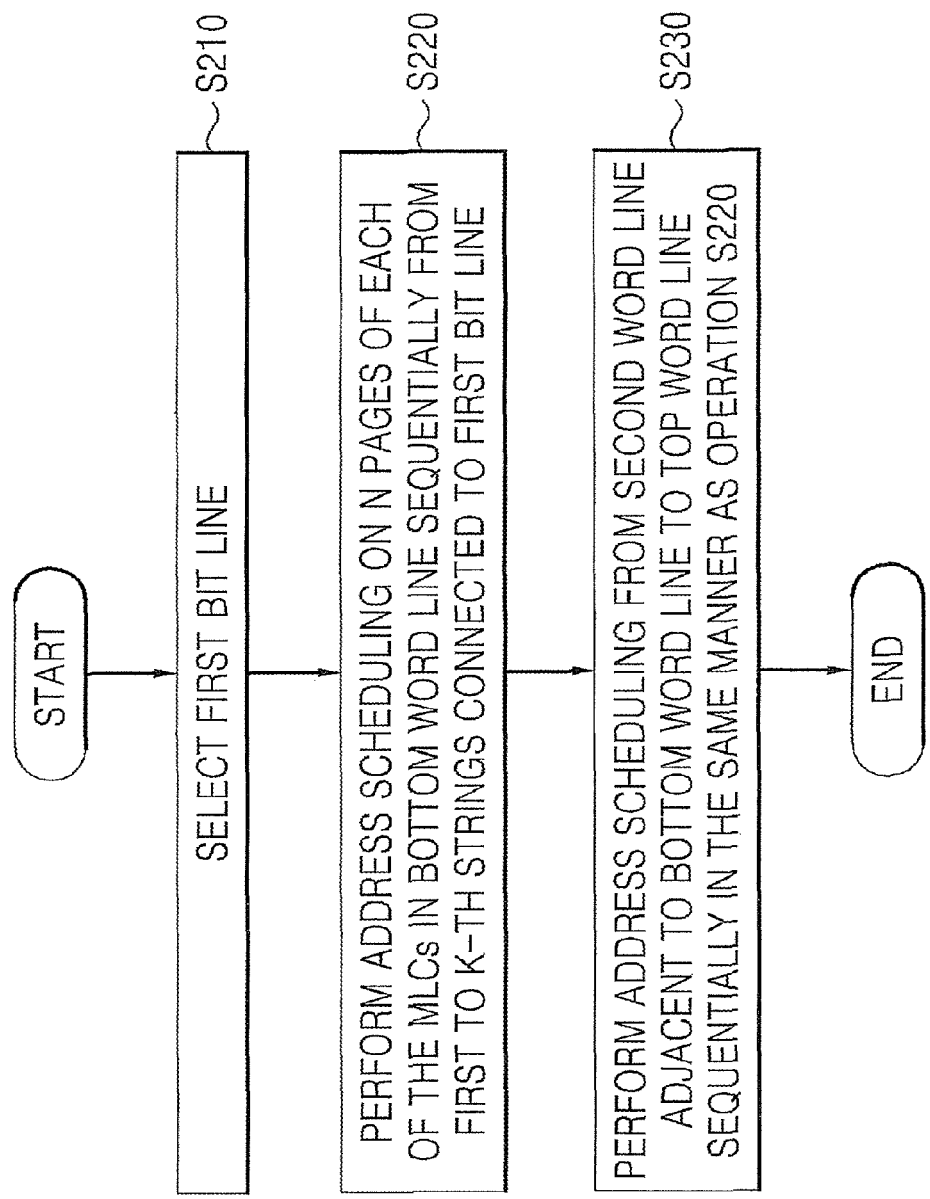

ADDRESS SCHEDULING METHODS FOR NON-VOLATILE MEMORY DEVICES WITH THREE-DIMENSIONAL MEMORY CELL ARRAYS

CROSS-REFERENCE TO RELATED APPLICATION

This application is a continuation of U.S. application Ser. No. 13/213,806, filed on Aug. 19, 2011, which claims priority under 35 U.S.C. §119(a) to Korean Patent Application No. 10-2010-0080964, filed on Aug. 20, 2010, in the Korean Intellectual Patent Office (KIPO), the entire contents of each of which are incorporated herein by reference.

BACKGROUND

Example embodiments relate to address scheduling methods for three-dimensional (3D) memory cell arrays, and more particularly, to address scheduling methods for 3D memory cell arrays in non-volatile memory devices including a plurality of multi-level cells.

Flash memory used as electrically erasable programmable read-only memory (EEPROM) may have an advantage of random access memory (RAM) in which data can be readily programmed and erased and an advantage of ROM in which data can be retained without supply of power.

Flash memory is usually divided into NAND flash memory and NOR flash memory. NOR flash memory may have a structure in which memory cells are independently connected to a bit line and a word line, thereby having an excellent random access time characteristic. On the other hand, NAND flash memory may be improved in terms of the degree of integration because of its structure in which a plurality of memory cells may be connected to one another, thereby requiring only one contact per cell string. Accordingly, the NAND structure is usually used in highly integrated flash memory.

Multi-bit cells which may be capable of storing plural data in a single memory cell. This type of a memory cell is generally called a multi-level cell (MLC). On the other hand, a memory cell capable of storing a single bit is called a single level cell (SLC).

There may occur a coupling effect between memory cells connected to adjacent word lines when a program operation is performed according to conventional address scheduling methods. To compensate for the coupling effect, a program bias voltage may be applied to two adjacent word lines alternately when a 2-bit MLC is programmed. These address scheduling methods, however, may deteriorate device operating speed.

SUMMARY

At least one example embodiment of the inventive concepts may provide address scheduling methods for increasing the operating performance of three-dimensional (3D) memory cell arrays.

According to at least one example embodiments of the inventive concepts, there is provided an address scheduling method for a non-volatile memory device with a 3D memory cell array including a plurality of multi-level cells each capable of storing N bits where N is 2 or a natural number greater than 2. The address scheduling method includes the operations of (a) selecting a first bit line, (b) selecting a first string connected to the first bit line, (c) performing address scheduling on N pages of each of multi-level cells in the first string sequentially from a bottom word line to a top word line, and (d) after completing the address scheduling on all word lines in the first string, performing address scheduling on second to k-th strings sequentially in the same manner as the operation (c) where "k" is 2 or a natural number greater than 2.

The address scheduling method may further include selecting another bit line after completing the address scheduling on all pages of a plurality of multi-level cells connected to the first bit line and performing the operations (b) through (d).

According to other example embodiments of the inventive concepts, there is provided an address scheduling method for a non-volatile memory device with a 3D memory cell array including a plurality of multi-level cells each capable of storing N bits where N is 2 or a natural number greater than 2. The address scheduling method includes the operations of (a) selecting a first bit line, (b) performing address scheduling on N pages of each of the multi-level cells in a bottom word line sequentially from first to k-th strings connected to the first bit line where "k" is 2 or a natural number greater than 2, and (c) after completing the address scheduling on the bottom word line, performing address scheduling on a second word line adjacent to the bottom word line to a top word line sequentially in the same manner as the operation (b).

According to further example embodiments of the inventive concepts, there is provided a 3D non-volatile memory device including a memory cell array which includes a plurality of multi-level cells each capable of storing N bits where N is 2 or a natural number greater than 2 and a control circuit configured to control address scheduling of the memory cell array.

The control circuit may control another bit line to be selected and the above-described operations (b) through (d) to be performed after the address scheduling on all pages of a plurality of multi-level cells connected to the first bit line is completed.

According to other example embodiments, a memory system includes the above-described 3D non-volatile memory device and a memory controller configured to control the 3D non-volatile memory device. The memory system may be a solid state drive (SSD).

According to yet other example embodiments, a data storage apparatus includes a plurality of memory modules forming a redundant array of independent disks (RAID) array, each of which includes a plurality of 3D non-volatile memory devices and a memory controller configured to control the operation of the 3D non-volatile memory devices; and a RAID controller configured to control the operation of the memory modules.

According to at least one example embodiment, an address scheduling method includes selecting a first bit line connected to first through kth strings of multi-level cells, where "k" is a natural number greater than or equal to 2, selecting and deselecting each of the strings sequentially from the first string to the kth string and performing address scheduling on N pages of each multi-level cell in each of the selected strings sequentially from a bottom word line to a top word line, where N is a natural number.

According to at least one example embodiment, an address scheduling method includes selecting a first bit line connected to first through kth strings of multi-level cells, where "k" is a natural number greater than or equal to 2, selecting and deselecting each of first word lines sequentially from a first bottom word line to a first top word line, and performing address scheduling on N pages of each multi-level cell connected to each of the selected first word lines sequentially from the first to kth string, where N is a natural number.

According to at least one example embodiment, a non-volatile memory device with a three-dimensional (3D) memory cell array includes a memory cell array including a plurality of multi-level cells each configured to store N bits, where N is a natural number greater than or equal to 2 and a control circuit configured to control address scheduling of the memory cell array, including selecting a first bit line of the memory cell array, the first bit line connected to first through kth strings of multi-level cells, where "k" is a natural number greater than or equal to 2, selecting and deselecting each of the strings sequentially from the first string to the kth string, and performing address scheduling on N pages of each multi-level cell in each of the selected strings sequentially from a bottom word line to a top word line.

According to at least one example embodiment, a non-volatile memory device with a three-dimensional (3D) memory cell array includes a memory cell array including a plurality of multi-level cells each configured to store N bits, where N is a natural number greater than or equal to 2 and a control circuit configured to control address scheduling of the memory cell array, including selecting a first bit line of the memory cell array, the first bit line connected to first through kth strings of multi-level cells, where "k" is a natural number greater than or equal to 2, selecting and deselecting each of first word lines sequentially from a first bottom word line to a first top word line, and performing address scheduling on N pages of each multi-level cell connected to each of the selected first word lines sequentially from the first to kth string.

According to at least one example embodiment, a data storage apparatus includes a plurality of memory modules in a redundant array of independent disks (RAID), each of the memory modules including a plurality of three-dimensional (3D) non-volatile memory devices and a memory controller configured to control the operation of the 3D non-volatile memory devices, each of the 3D non-volatile memory devices including a memory cell array including a plurality of multi-level cells configured to store N bits, where N a natural number greater than or equal to 2, and a control circuit configured to control address scheduling of the memory cell array, the control circuit configured to select a first bit line of the memory cell array, the first bit line connected to first through kth strings of multi-level cells, where "k" is a natural number greater than or equal to 2, select and deselect each of first word lines sequentially from a first bottom word line to a first top word line, and perform address scheduling on N pages of each multi-level cell connected to each of the selected first word lines sequentially from the first to kth string, and a RAID controller configured to control the operation of the memory modules.

BRIEF DESCRIPTION OF THE DRAWINGS

Example embodiments of the inventive concepts will be more clearly understood from the following brief description taken in conjunction with the accompanying drawings. FIGS. 1-11 represent non-limiting, example embodiments as described herein.

FIG. 1 is a block diagram illustrating non-volatile memory systems according to at least one example embodiments of the inventive concepts;

FIG. 2 is a circuit diagram illustrating a memory cell array of FIG. 1 in two dimensions;

FIG. 3 is a circuit diagram illustrating a memory cell array of FIG. 1 in three dimensions;

FIGS. 5A and 5B are block diagrams illustrating address scheduling methods for a 3D non-volatile memory device according to at least one example embodiments of the inventive concepts;

FIGS. 6A and 6B are flowcharts of the address scheduling methods illustrated in FIGS. 5A and 5B, respectively;

FIGS. 7-10 illustrate memory systems including the non-volatile memory device of FIG. 1 according to different example embodiments of the inventive concepts; and FIG. 11 is a block diagram illustrating data storage apparatuses including the memory system of FIG. 10.

Figure 1:
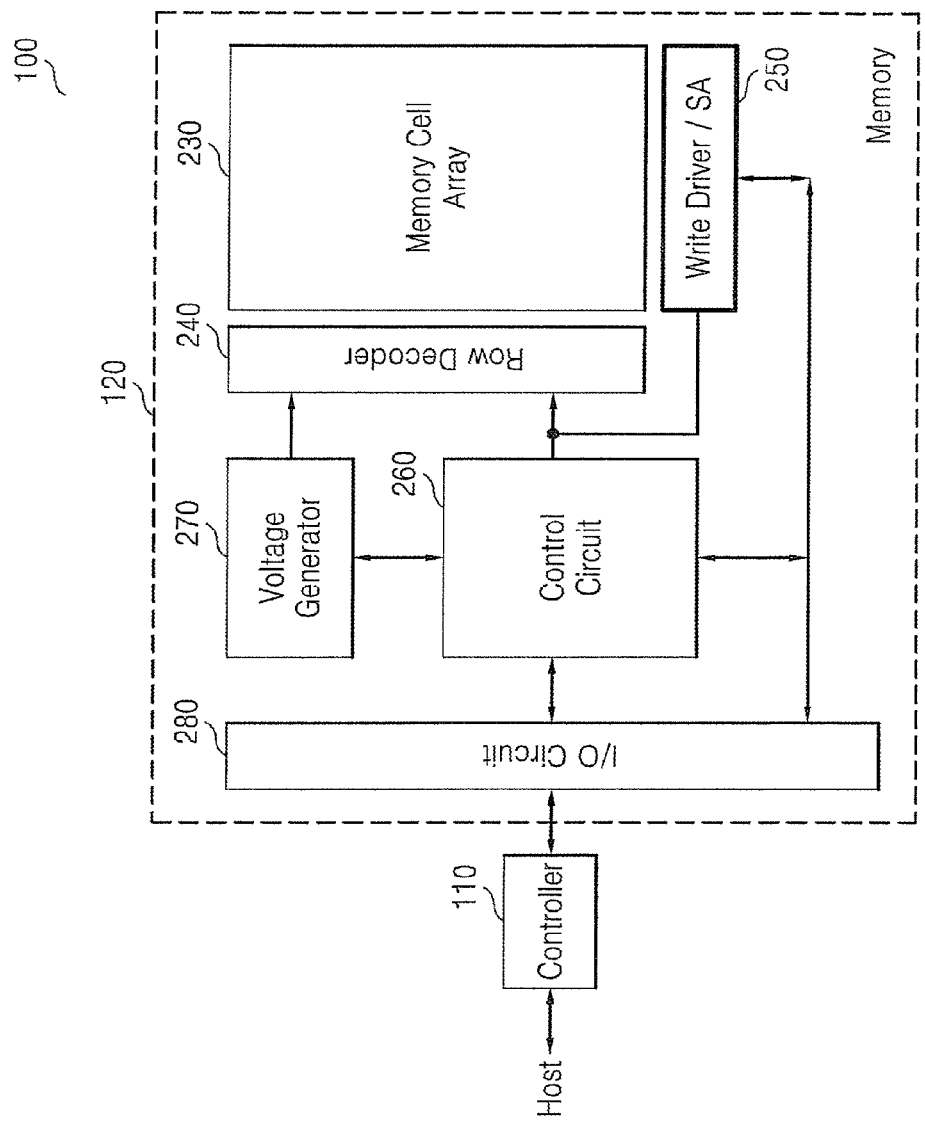

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a block diagram illustrating non-volatile memory systems 100 according to at least one example embodiment of the inventive concepts. A non-volatile memory system 100 may include a non-volatile memory device 120 and a memory controller 110 controlling the non-volatile memory device 120. The non-volatile memory device 120 may be a NOR flash memory and/or a NAND flash memory, but the example embodiments are not restricted thereto. The non-volatile memory device 120 may include a memory cell array 230, a row decoder 240, a write driver/sense amplifier (SA) circuit 250, a control circuit 260, a voltage generator 270 and an input/output (I/O) circuit 280.

The row decoder 240 may select one word line from among a plurality of word lines in response to a row address, may apply a first operating voltage to the selected word line and may apply a second operating voltage to unselected word lines. For instance, the row decoder 240 may apply the first operating voltage (e.g., a program voltage) to the selected word line and the second operating voltage (e.g., a pass voltage) to the unselected word lines in a program operation and may apply the first operating voltage (e.g., a read reference voltage) to the selected word line and the second operating voltage (e.g., a read voltage) to the unselected word lines in a read operation.

The write driver/SA circuit 250 may be selectively connected to a plurality of bit lines and may write and/or program data to a selected memory cell and/or may read data from the selected memory cell by sensing and amplifying the data. The write driver/SA circuit 250 may include a plurality of data storage units (not shown) to store data set to be programmed in the program operation and to store a data set read from memory cells in the read operation. Each of the data storage units may be implemented by a plurality of latches. The data storage units may also store a data set read in a program verify operation. A switching block (not shown) may be between the write driver/SA circuit 250 and the memory cell array 230 to selectively connect a write driver and/or a SA to the plurality of bit lines.

The control circuit 260 may output internal control signals (not shown) for controlling operations, such as program operations, erase operations, and read operations, of the non-volatile memory device 120 in response to an external command. The control circuit 260 may control address scheduling of the memory cell array 230. The address scheduling may include scheduling an address sequence. When multi-level cells (MLCs) capable of storing two bits include two pages in the memory cell array 230, the control circuit 260 may schedule an address sequence for the pages of the MLCs.

The voltage generator 270 may generate voltages, such as a program voltage, a pass voltage, and a read voltage, for the operations of the non-volatile memory device 120. The I/O circuit 280 may interface the non-volatile memory device 120 with the outside (e.g., the memory controller 110). The I/O circuit 280 may receive a command and/or data to be programmed from the outside and/or transmit a state signal and/or read data to the outside. The memory controller 110 may control overall data exchange between a host and the non-volatile memory device 120. For example, the memory controller 110 may control the non-volatile memory device 120 to write data and/or read data in compliance with the host.

Figure 2:
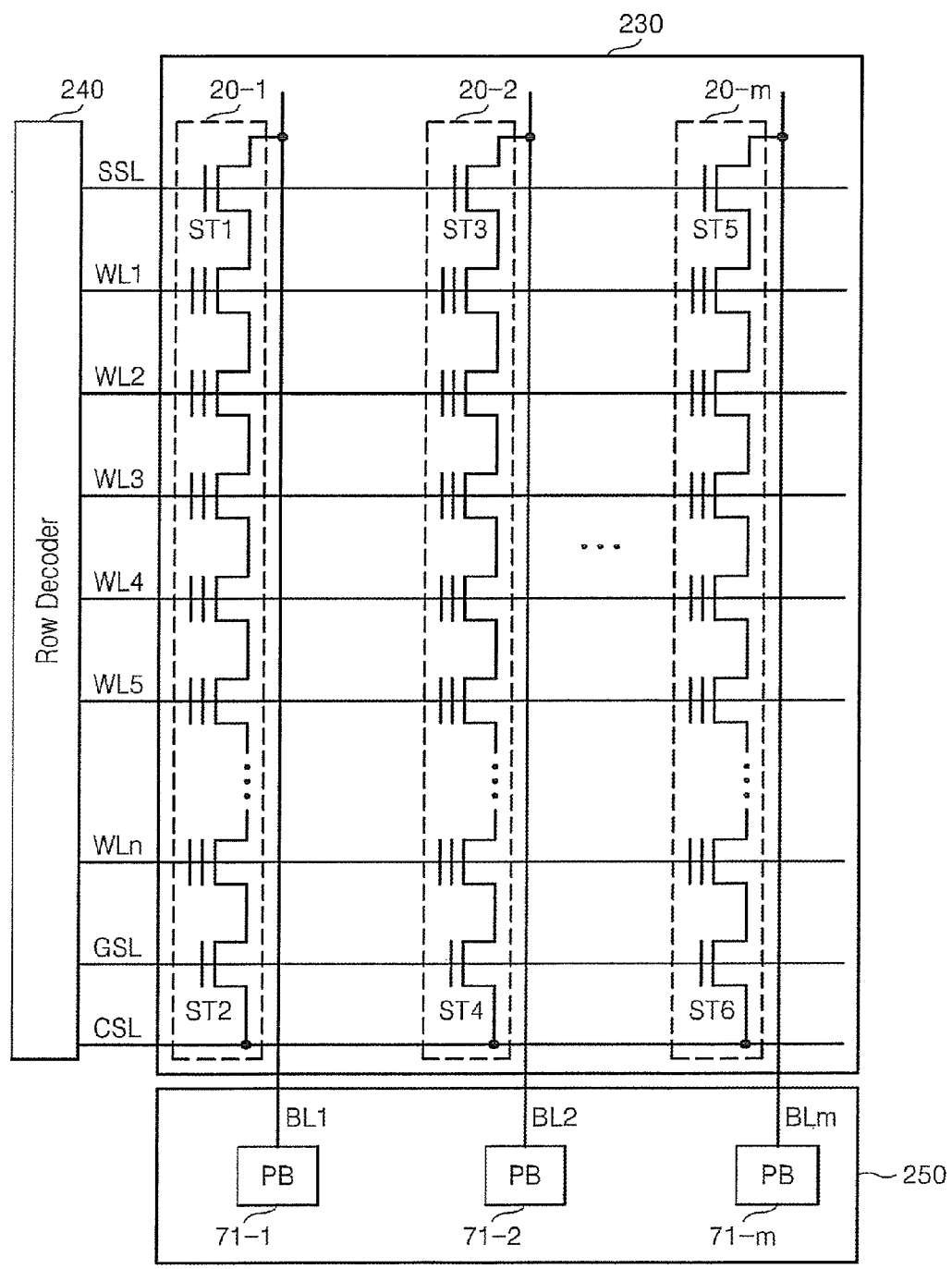
Figure 3:
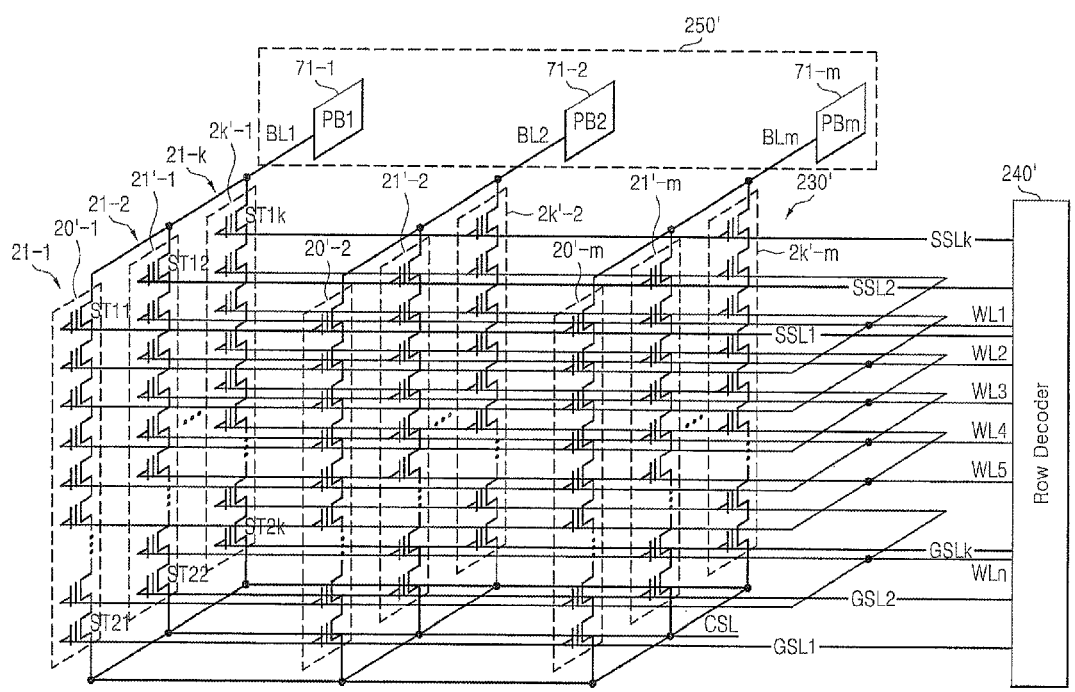

FIG. 2 is a circuit diagram illustrating a memory cell array 230 of FIG. 1 in two dimensions. FIG. 3 is a circuit diagram illustrating a memory cell array 230' as an example of a memory cell array 230 of FIG. 1 in three dimensions. Referring to FIG. 2, the memory cell array 230 may include a plurality of cell strings 20-1, 20-2, . . . , and 20-$m$ where "m" is a natural number. Each of the cell strings 20-1 through 20-$m$ may include a plurality of non-volatile memory cells. The cell strings 20-1 through 20-$m$ may be disposed in two dimensions on one plane in the memory cell array 230, as illustrated in FIG. 2, or cell strings 20'-1 through 2k'-m may be disposed in three dimensions on different planes and/or layers in a memory cell array 230', as illustrated in FIG. 3.

The cell string 20-1 illustrated in FIG. 2 may include a first selection transistor ST1 connected to a bit line BL1, a second selection transistor ST2 connected to ground, and a plurality of non-volatile memory cells connected in series between the first and second selection transistors ST1 and ST2. The cell string 20-2 may include a third selection transistor ST3 connected to a bit line BL2, a fourth selection transistor ST4 connected to the ground, and a plurality of non-volatile memory cells connected in series between the third and fourth selection transistors ST3 and ST4. The cell string 20-m may include a fifth selection transistor ST5 connected to a bit line BLm, a sixth selection transistor ST6 connected to ground, and a plurality of non-volatile memory cells connected in series between the fifth and sixth selection transistors ST5 and ST6.

The non-volatile memory cells included in each of the cell strings 20-1 through 20-m may be implemented by electrically erasable programmable read-only memory (EEPROM) cells that can store one or more bits. The non-volatile memory cells may be implemented by NAND flash memory cells (e.g., single level cells (SLCs) or MLCs) which can store one or more bits. The cell strings 20-1 through 20-m may be referred to as NAND strings. String selection lines SSL may be connected to the selection transistors (e.g., ST1, ST2 and ST3). A common source line CSL may be connected to selection transistors (e.g., ST2, ST4 and ST6). Word lines WL1-WLn may be connected to the plurality of non-volatile memory cells. A page buffer PB (e.g., 71-1 through 71-m) may be connected to each bit line (e.g., BL1-BLm).

As used herein, letters representing a variable, for example a natural number, are not limited by a number corresponding to a position in the alphabet. Rather, letters representing a variable herein may be any number extending from a sequence (e.g., for 20-1, 20-2, . . . , and 20-m, "m" may be any natural number greater than 2). For example, the letters "m" and "k" representing natural numbers, as used herein, may be variables representing any natural number. Further, combinations of letters and numbers are not constrained to a specific range. For example, 2k' of 2k'-m is not limited to ten digits and expresses a variable that may be of any magnitude. The specific labeling herein using variables, and variable-number combinations, is for purposes of explanation only and a number of cells, cell strings, cells per cell string, layers and other features of example embodiments may differ due to, for example, an application of example embodiments.

Referring to FIG. 3, each of a plurality of layers 21-1, 21-2, . . . , 21-k (where "k" is a natural number) may include a plurality of cell strings. The first layer 21-1 may include a plurality of cell strings 20'-1 through 20'-m, the second layer 21-2 may include a plurality of cell strings 21'-1 through 21'-m, and the k-th layer 21-k may include a plurality of cell strings 2k'-1 through 2k'-m. As illustrated in FIG. 3, a first cell string 20'-1 may be disposed in the first layer 21-1, a second cell string 21'-1 may be disposed in the second layer 21-2 different from the first layer 21-1, and a k-th cell string 2k'-1 may be disposed in the k-th layer 21-k different from the second layer 21-2 so that the first through k-th cell strings 20'-1, 21'-1, and 2k'-1 are disposed in three dimensions.

The first cell string 20'-1 in the first layer 21-1 may include a plurality of non-volatile memory cells (e.g., NAND flash memory cells) connected in series between a plurality of selection transistors ST11 and ST21. The second cell string 21'-1 in the second layer 21-2 may include a plurality of non-volatile memory cells (e.g., NAND flash memory cells) connected in series between a plurality of selection transistors ST12 and ST22. The k-th cell string 2k'-1 in the k-th layer 21-k may include a plurality of non-volatile memory cells (e.g., NAND flash memory cells) connected in series between a plurality of selection transistors ST1k and ST2k.

A row decoder 240' illustrated in FIG. 3 may provide selection signals (e.g., a read voltage during a read operation, a power supply voltage during a program operation and 0 V during an erase operation) to string selection lines SSL1, SSL2, . . . , and SSLk connected to the gates of the first selection transistors ST11, ST12, . . . , and ST1k, respectively, implemented in the layers 21-1 through 21-k, respectively. The first selection transistors ST11-ST1k may be selectively turned on or off. The row decoder 240' may also provide selection signals (e.g., the read voltage during the read operation and 0 V during the program operation and the erase operation) to ground selection lines GSL1, GSL2, . . . , and GSLk connected to the gates of the second selection transistors ST21, ST22, . . . , and ST2k, respectively, implemented in the layers 21-1 through 21-k, respectively. The second selection transistors ST21 through ST2k may be selectively turned on or off. Each of the cell strings 20'-1 through 2k'-m implemented in the respective layers 21-1 through 21-k may be selected by the row decoder 240'.

As illustrated in FIG. 3, the cell strings 20'-1 through 2k'-1 may share with one another a plurality of word lines WL1-WLn, a common source line CSL and a bit line BL1. Cell strings at corresponding positions in the respective layers 21-1 through 21-k may be connected to a corresponding one among the page buffers 71-1 through 71-m included in a write driver/SA circuit 250'.

Figure 4A:
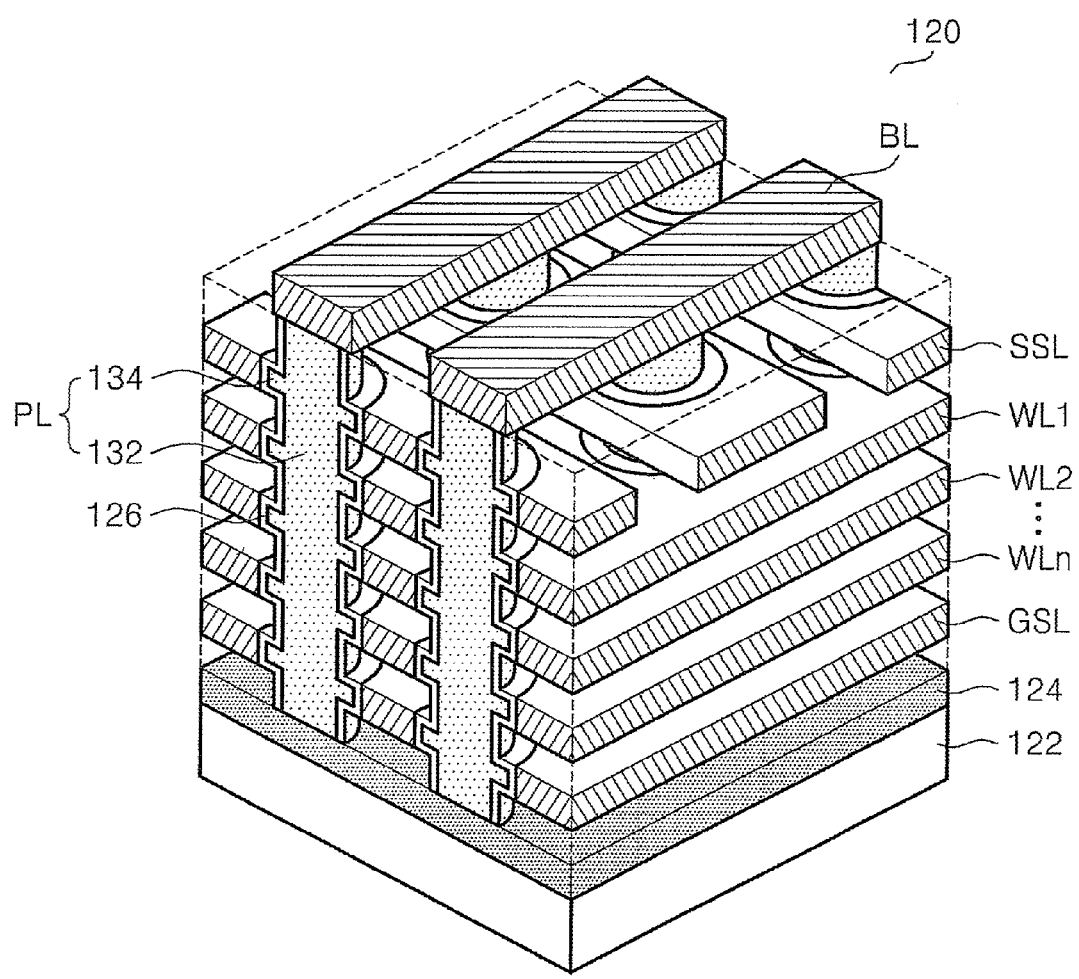
FIG. 4A is a perspective view of a non-volatile memory device according to at least one example embodiments of the inventive concepts.
Figure 4B:
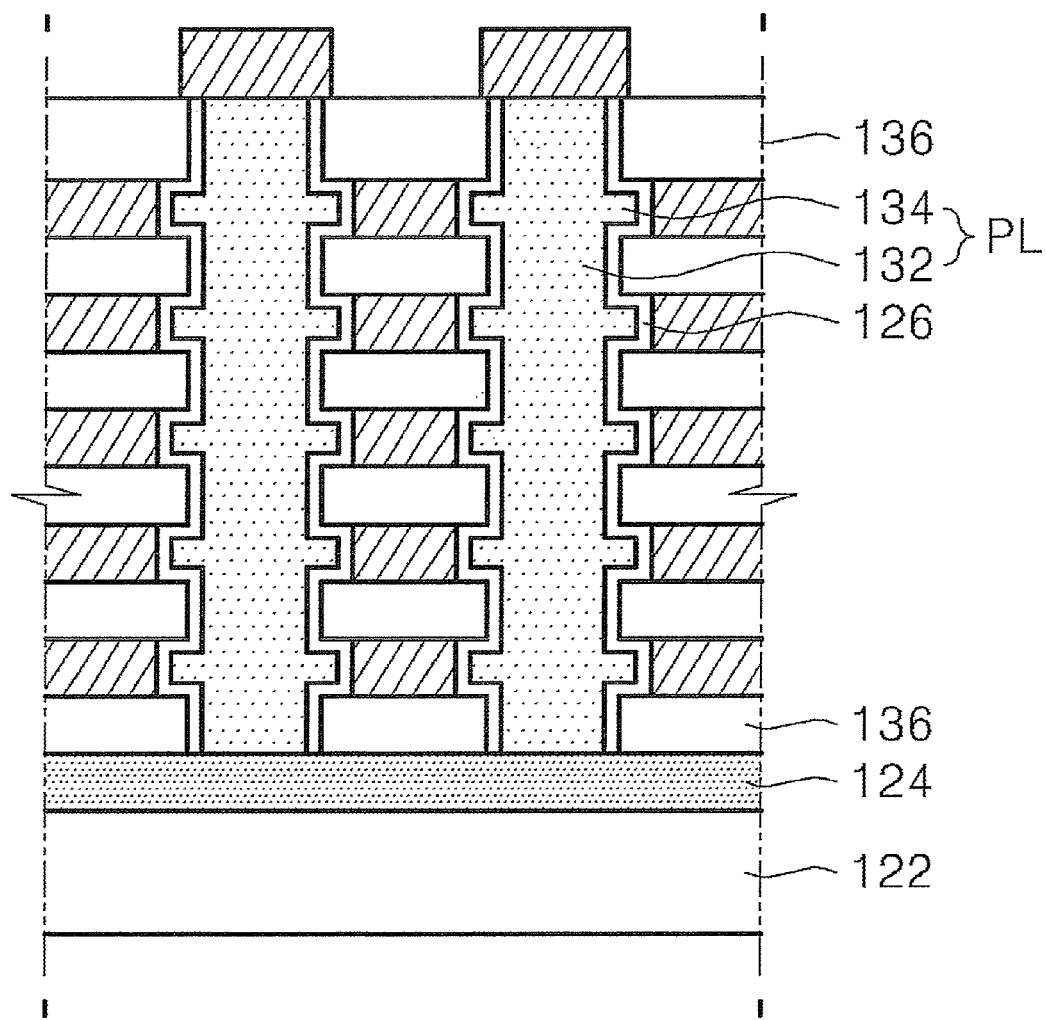
FIG. 4B is a cross-sectional diagram of the non-volatile memory device illustrated in FIG. 4A.

FIG. 4A is a perspective view of a non-volatile memory device 120 according to at least one example embodiments of the inventive concepts. FIG. 4B is a cross-sectional diagram of the non-volatile memory device 120 illustrated in FIG. 4A. Referring to FIGS. 4A and 4B, gate interlayer insulating layers 136 and conductive layers GSL, WL1-WLn, and SSL may be alternately and repeatedly stacked on a semiconductor substrate 122. A well region 124 may be on the semiconductor substrate 122 and may be a common source line CSL. The well region 124 may include, for example, an n+ conductivity type region. The gate interlayer insulating layers 136 and the conductive layers GSL, WL1-WLn, and SSL may be alternately stacked on the well region 124. The conductive layers GSL, WL1-WLn, and SSL may be sequentially stacked in order of GSL, WLn-WL1, and SSL. The gate interlayer insulating layers 136 may include an insulating material (e.g., a silicon oxide layer and/or a silicon nitride layer).

Among the stacked conductive layers GSL, WL1-WLn, and SSL, the top and bottom layers SSL and GSL may be used as a string selection line and ground selection line and the remaining conductive layers WL1-WLn may be used as word lines. The word lines WL1-WLn may include a conductive material (e.g., poly silicon and/or metal). A plurality of active pillars PL may pierce through the gate interlayer insulating layers 136 and the conductive layers GSL, WL1-WLn, and SSL. The active pillars PL may include, for example, a semiconductor material and may correspond to cell strings in a non-volatile memory device 120. The channels of selection transistors and memory cell transistors in each string may be electrically connected through the active pillars PL. The active pillars PL may be separated from one another, and may be electrically connected to the well region 124 on the semiconductor substrate 122 by piercing through the conductive layers GSL, WL1-WLn, and SSL.

The active pillars PL may protrude toward the conductive layers GSL, WL1-WLn, and SSL at each of the conductive layers GSL, WL1-WLn, and SSL. Each of the active pillars PL may include a body 132 extending vertically from the top of the semiconductor substrate 122 and a plurality of protrusions 134 which may extend from the body 132 toward the conductive layers GSL, WL1-WLn, and SSL and may be separated from one another. At each of the conductive layers GSL, WL1-WLn, and SSL, a protrusion 134 may face a corresponding one of the conductive layers GSL, WL1-WLn, and SSL, surrounding the body 132.

On the active pillars PL may be formed bit lines BL electrically connected to the active pillars PL. Each of the bit lines BL may cross string selection lines SSL and may be electrically connected to active pillars PL in one row and/or column among the active pillars PL. A channel may be formed at each of the protrusions 134 during operation of the non-volatile memory device 120. A charge storage layer pattern 126 may be between the protrusions 134 of each active pillar PL and the side walls of the conductive layers GSL, WL1-WLn, and SSL. The charge storage layer pattern 126 may contact the conductive layers GSL, WL1-WLn, and SSL and may cover the surface of the protrusions 134 and the body 132 of each active pillar PL. A pattern of the charge storage layer pattern 126 may be a ribbed pattern and may reduce interference between cells compared to a straight line shaped charge storage layer pattern.

When a three-dimensional (3D) non-volatile memory device is of a structure illustrated in FIGS. 4A and 4B, address scheduling methods according to example embodiments may be used for the 3D non-volatile memory device. Program performance may increase.

Figure 5B:
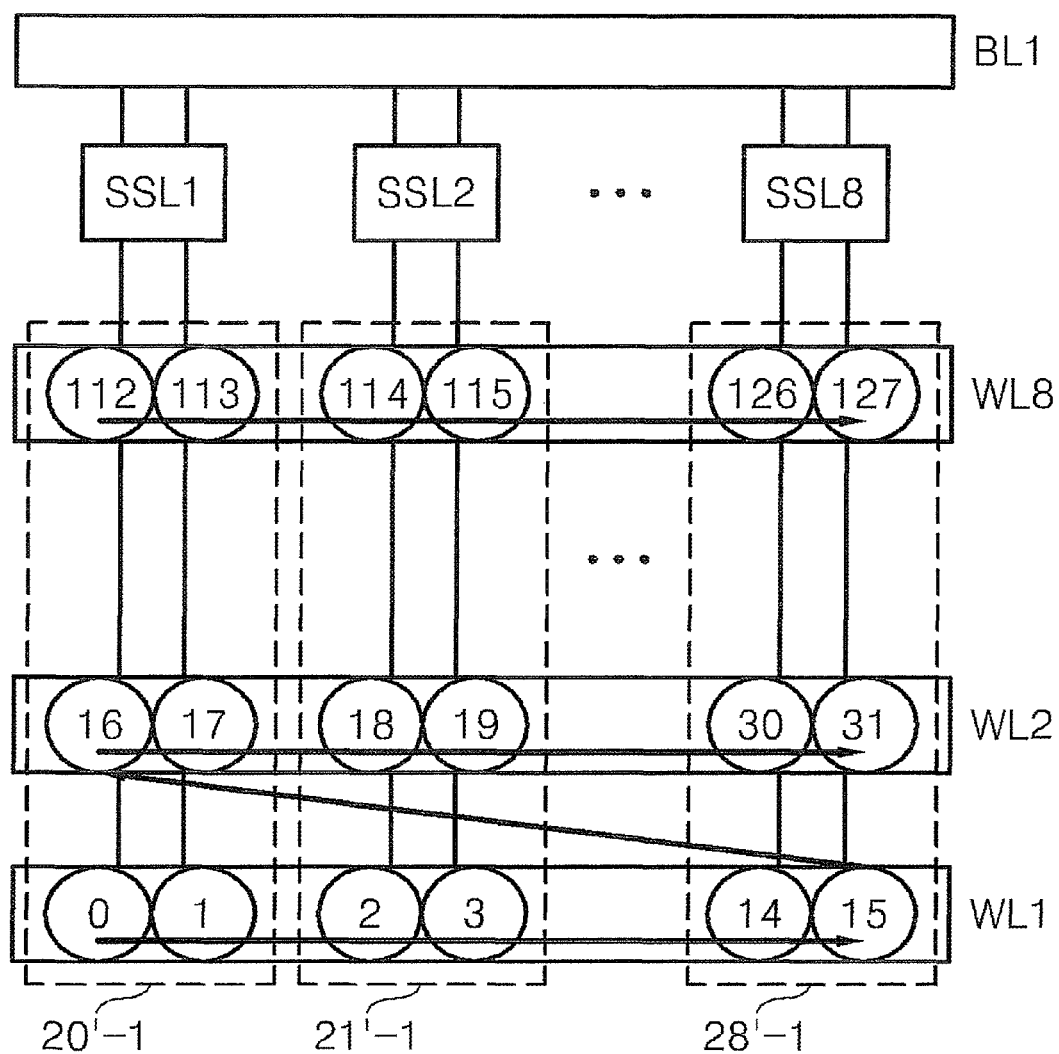

FIGS. 5A and 5B are block diagrams illustrating address scheduling methods for a 3D non-volatile memory device according to at least one example embodiments of the inventive concepts. FIGS. 5A and 5B may illustrate string selection lines SSL1-SSLk, bit line BL1 and word lines WL1-WLn illustrated in FIG. 3. Each of the word lines WL1-WLn may be connected to a plurality of MLCs. Each of the MLCs may include N pages to program N bits where N may be 2 or a natural number greater than 2. For example, when each MLC may store two bits, the MLC may include two pages. Example embodiments may be explained with reference to an MLC that may store two bits, but example embodiments of the inventive concepts may not be restricted thereto.

Referring to FIG. 5A, a first string selection line SSL1 connected to a bit line BL1 may be selected and bottom to top word lines WL1-WLn may be sequentially selected. In a program operation, after all pages (e.g., first and second pages) of an MLC connected to the first string selection line SSL1 at the bottom word line WL1 are programmed, all pages of an MLC connected to the first string selection line SSL1 at the next word line WL2 adjacent to the bottom word line WL1 may be programmed. All pages may be sequentially programmed up to the top word line WLn. Address scheduling of the second string selection line SSL2 may be performed (e.g., after the address scheduling of the first string selection line SSL1 may be completed) in the same manner. Address scheduling may be performed through to the last (e.g., the k-th) string selection line SSLk. When there may be 8 word lines WL1-WL8 and 8 string selection lines SSL1-SSL8 with 8 strings 20'-1 to 28'-1, as shown in FIG. 5A, the address scheduling may be performed as illustrated for 0-127 numbered in the arrow-headed direction illustrated in FIG. 5A.

Referring to FIG. 5B, addresses may be scheduled sequentially from the bottom word line WL1 to the top word line WLn with respect to the bit line BL1. Differently from the address scheduling method illustrated in FIG. 5A, the address scheduling illustrated in FIG. 5B may select one of the word lines WL1-WLn first and sequentially select the first to the k-th string selection lines SSL1-SSLk with respect to the selected word line. For example, pages (e.g., first and second pages) of all MLCs connected to the bottom word line WL1 may be sequentially programmed from the first string selection line SSL1 to the k-th string selection line SSLk. After the address scheduling of the bottom word line WL1 may be completed, all pages of the next word line WL2 may be programmed in the same manner. All pages may be sequentially programmed up to the top word line WLn. When there may be 8 word lines WL1-WL8 and 8 string selection lines SSL1-SSL8 as shown in FIG. 5B, the address scheduling may be performed as shown for 0-127 numbered in the arrow-headed direction illustrated in FIG. 5B.

When the address scheduling methods illustrated in FIGS. 5A and 5B are used, a program operation may be carried out by only applying a bias voltage one time to each of word lines instead of sequentially and alternately applying the bias voltage to the word lines, and the speed of the program operation may be increased.

Figure 6A:
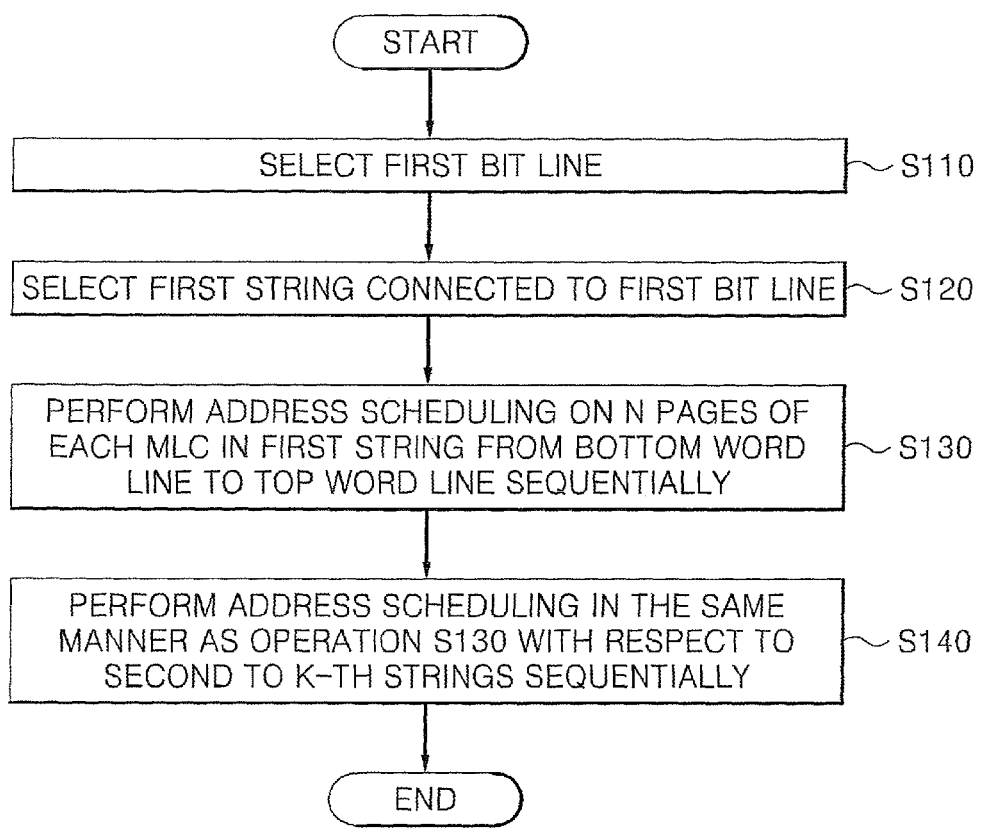

FIGS. 6A and 6B are flowcharts of the address scheduling methods illustrated in FIGS. 5A and 5B, respectively. Referring to FIG. 6A, a first bit line may be selected in operation S110. A first string connected to the first bit line may be selected in operation S120. Address scheduling may be performed on N pages of each MLC in the first string sequentially from a bottom word line to a top word line in operation S130. Address scheduling may be performed in the same manner as operation S130 with respect to second to k-th strings sequentially (e.g., after the address scheduling of the pages of all word lines in the first string may be completed) in operation S140 where "k" may be 2 or a natural number greater than 2. After address scheduling of the pages of all MLCs connected to the first bit line may be completed, another bit line may be selected and operations S120-S140 may be performed.

Referring to FIG. 6B, a first bit line may be selected in operation S210. Address scheduling may be performed on N pages of each of the MLCs in a bottom word line sequentially from first to k-th strings connected to the first bit line in operation S220 where "k" may be 2 or a natural number greater than 2. Address scheduling may be performed from a second word line adjacent to the bottom word line to a top word line (e.g., after the address scheduling on the bottom word line may be completed) sequentially in the same manner as operation S220 in operation S230. After address scheduling of the pages of all MLCs connected to the first bit line are completed, another bit line may be selected and operations S220 and S230 may be performed.

Figure 7:
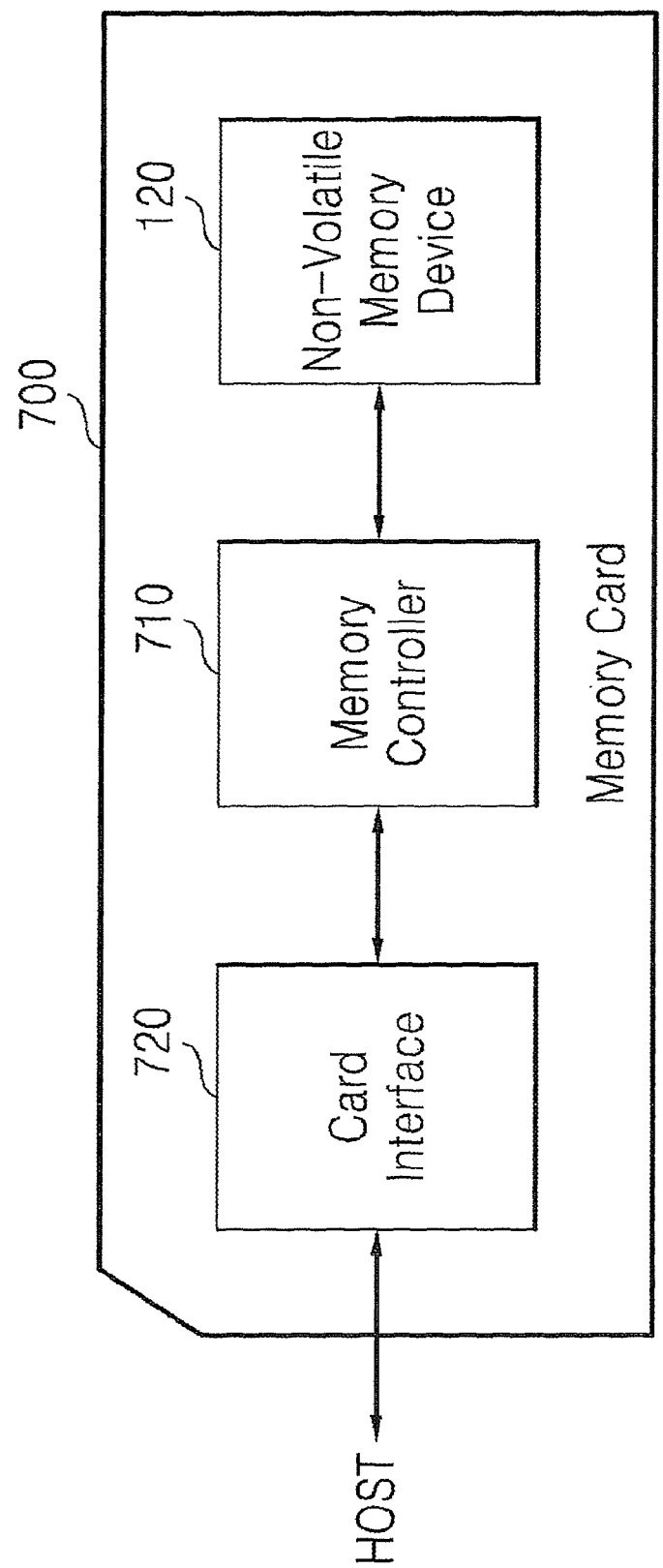

FIG. 7 is a block diagram of memory systems 700 including non-volatile memory devices 120 illustrated in FIG. 1 according to at least one example embodiment of the inventive concepts. A memory system 700 illustrated in FIG. 7 may be, for example, a flash memory card including a non-volatile memory device 120 controlling operating time according to an operating voltage applied to a selected word line, a memory controller 710 and a card interface 720. The memory controller 710 may control data exchange between the non-volatile memory device 120 and the card interface 720.

A memory system 700 may be a smart card. The card interface 720 may be a secure digital (SD) card interface and/or a multi-media card (MMC) interface, but example embodiments are not limited thereto. The card interface 720 may control data exchange between a host HOST and the memory controller 710 according to the type of the host HOST. When a memory system 700 is connected to a host (e.g., a computer, a digital camera, a digital audio player, a cellular phone, a console video game hardware, and/or a digital set-top box) the memory controller 710 of the memory system 700 and a controller included in the host HOST may transmit and receive data stored in the non-volatile memory device 120.

Figure 8:
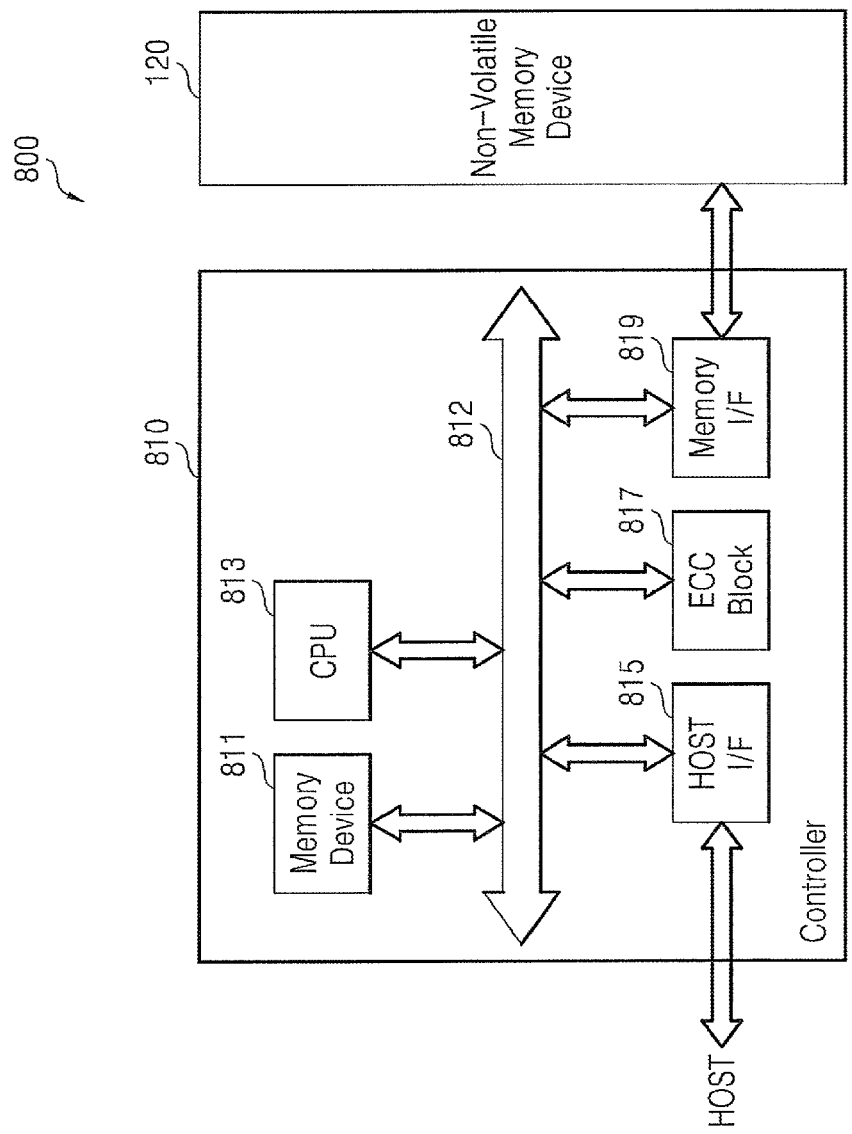

FIG. 8 is a block diagram of memory systems 800 including non-volatile memory devices 120 illustrated in FIG. 1 according to other example embodiments of the inventive concepts. Referring to FIG. 8, a memory system 800 may be a flash memory apparatus and may include a non-volatile memory device 120 controlling operating time according to an operating voltage applied to a selected word line, and a memory controller 810 controlling the operation of the non-volatile memory device 120. The memory controller 810 may include a memory device 811 that may be used as an operation memory for a central processing unit (CPU) 813. The memory device 811 may include dynamic random access memory (DRAM) and/or a static RAM (SRAM).

A host interface 815 may transfer data between a host HOST connected to the memory system 800 and the memory controller 810 according to the protocol of the host HOST. An error correction code (ECC) block 817 may detect and correct errors in data read from the non-volatile memory device 120. A memory interface 819 may transfer data between the non-volatile memory device 120 and the memory controller 810. The CPU 813 may control data exchange among the memory device 811, the host interface 815, the ECC block 817, and the memory interface 819 through a bus 812. The memory system 800 may be, for example, a universal serial bus (USB) flash drive and/or a memory stick.

Figure 9:
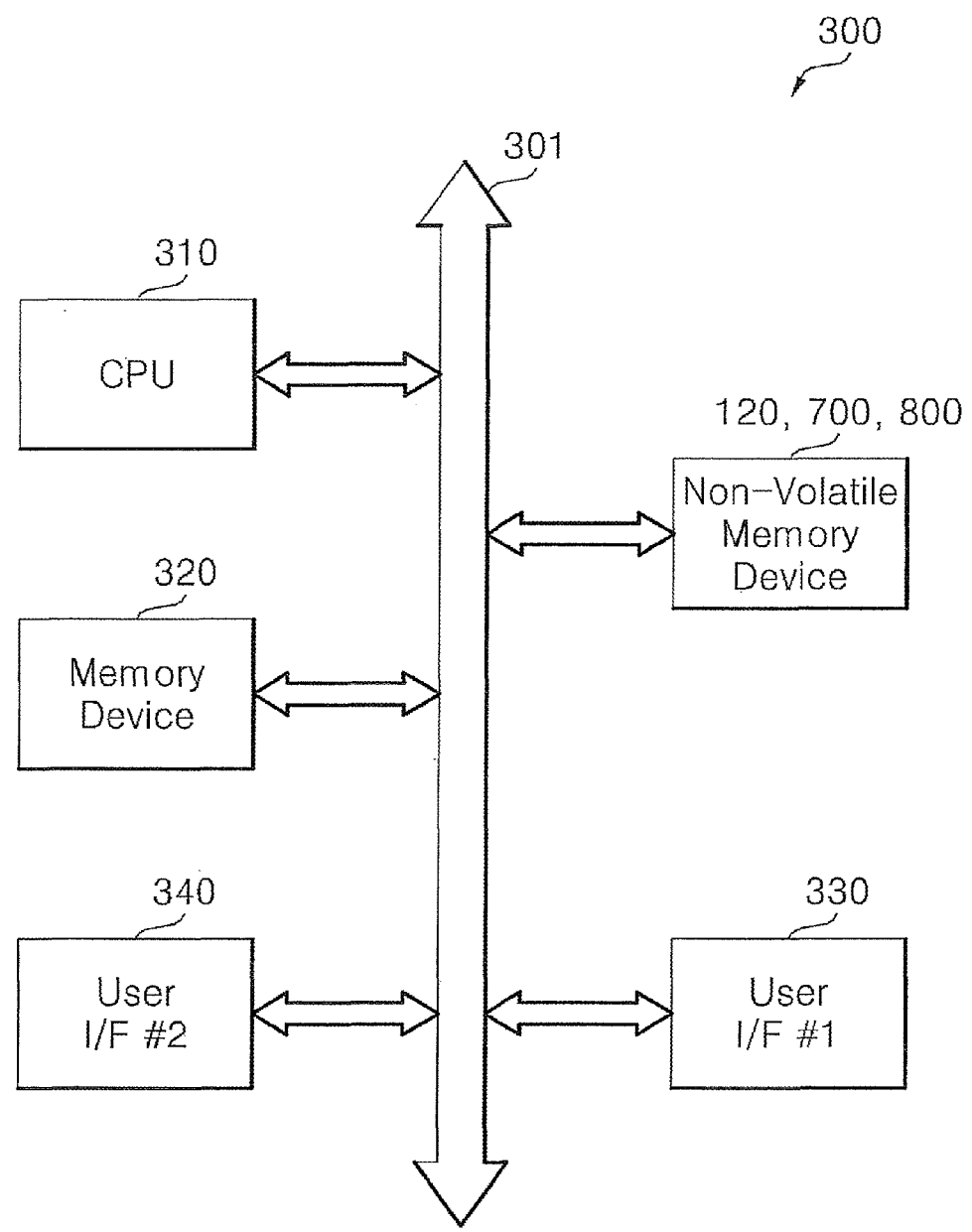

FIG. 9 is a block diagram of memory systems 300 including non-volatile memory devices 120 illustrated in FIG. 1 according to further example embodiments of the inventive concepts. Referring to FIG. 9, a memory system 300 may be, for example, a cellular phone, a smart phone, a personal digital assistant (PDA), a digital camera, a portable game console, an MP3 player, a high-definition television (HDTV), a global positioning system (GPS), a navigator, consumer equipment (CE), a digital set-top box, and/or an information technology (IT) device. The memory system 300 may include a CPU 310 and at least one non-volatile memory device 120 which may be connected to each other through a bus 301. The memory system 300 may include the CPU 310 and the memory system 700 and/or 800 illustrated in FIG. 7 or 8, which may be connected to each other through the bus 301.

The CPU 310 may control the operations (e.g., program, read and erase operations) and/or data transmission to a host of a non-volatile memory device 120 and/or a memory system 700 and/or 800. A memory device 320 connected to the bus 301 may be used as an operation memory for the CPU 310. The memory device 320 may include DRAM and/or SRAM. The memory device 320 may be a memory module (e.g., a single inline memory module (SIMM) and/or a dual inline memory module (DIMM)) including a plurality of non-volatile memory devices 120 illustrated in FIG. 1.

The memory system 300 may include a first user interface 330, for example, a display and/or a touch pad. The memory system 300 may include a second user interface 340 such as an I/O interface. The second user interface 340 may be an output device, or example, a printer and/or an input device (e.g., a keyboard and/or a mouse). The first user interface 330 may be replaced by, for example, a complementary metal-oxide semiconductor (CMOS) image sensor. The CMOS image sensor may be controlled by the CPU 310 to convert an optical image into a digital image and store the digital image in the non-volatile memory device 120 and/or the memory system 700 and/or 800.

Figure 10:
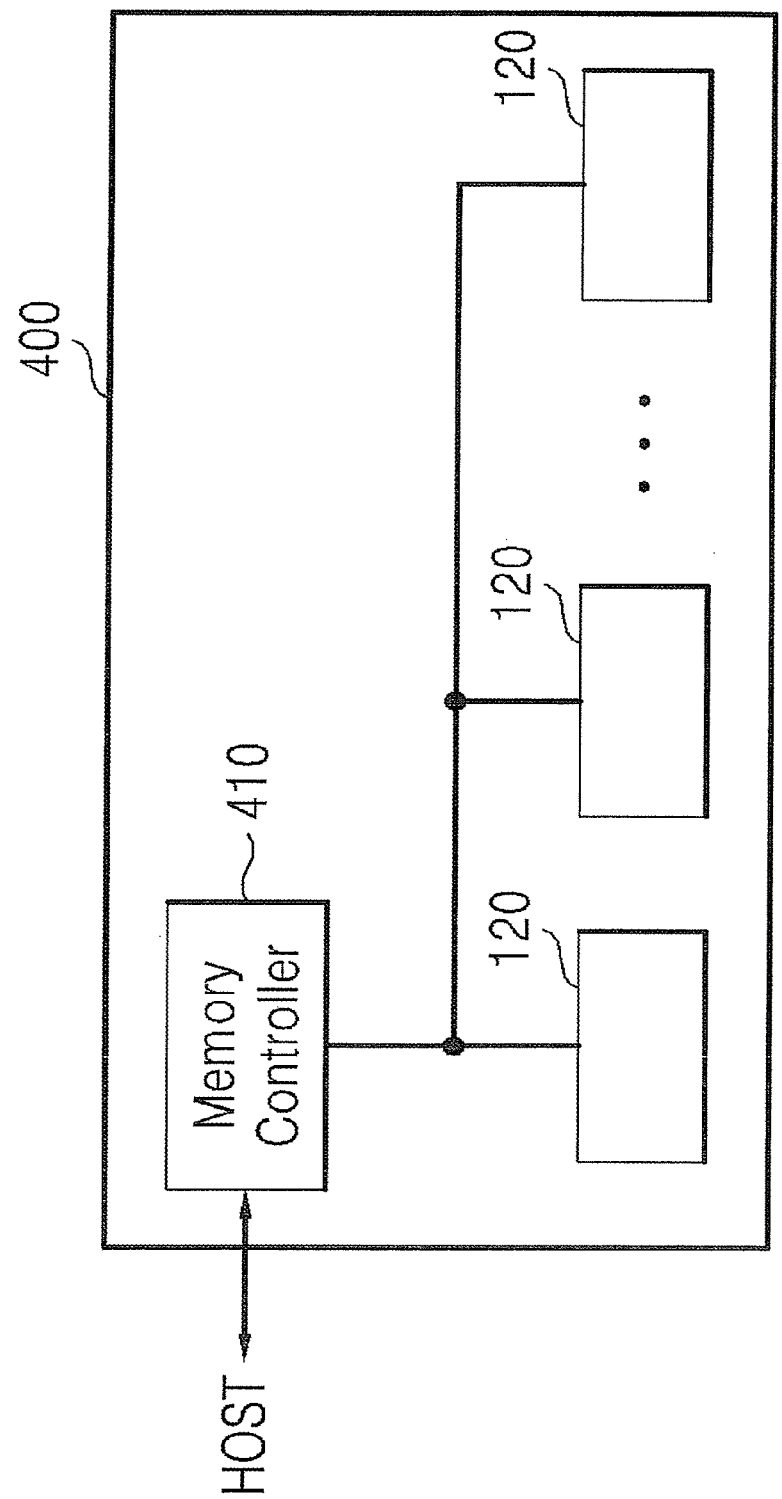

FIG. 10 is a block diagram of memory systems 400 including non-volatile memory devices 120 illustrated in FIG. 1 according to yet other example embodiments of the inventive concepts. Referring to FIG. 10, a memory system 400 may be or may include a solid state drive (SSD). The memory system 400 may include a plurality of non-volatile memory devices 120 and a memory controller 410 controlling the operation of the non-volatile memory devices 120. Each of the non-volatile memory devices 120 may adaptively control operating time for determining and/or verifying whether a selected memory cell among a plurality of non-volatile memory cells in each non-volatile memory device 120 has been programmed and/or erased in compliance with the memory controller 410. The memory controller 410 may communicate with a host HOST.

Figure 11:
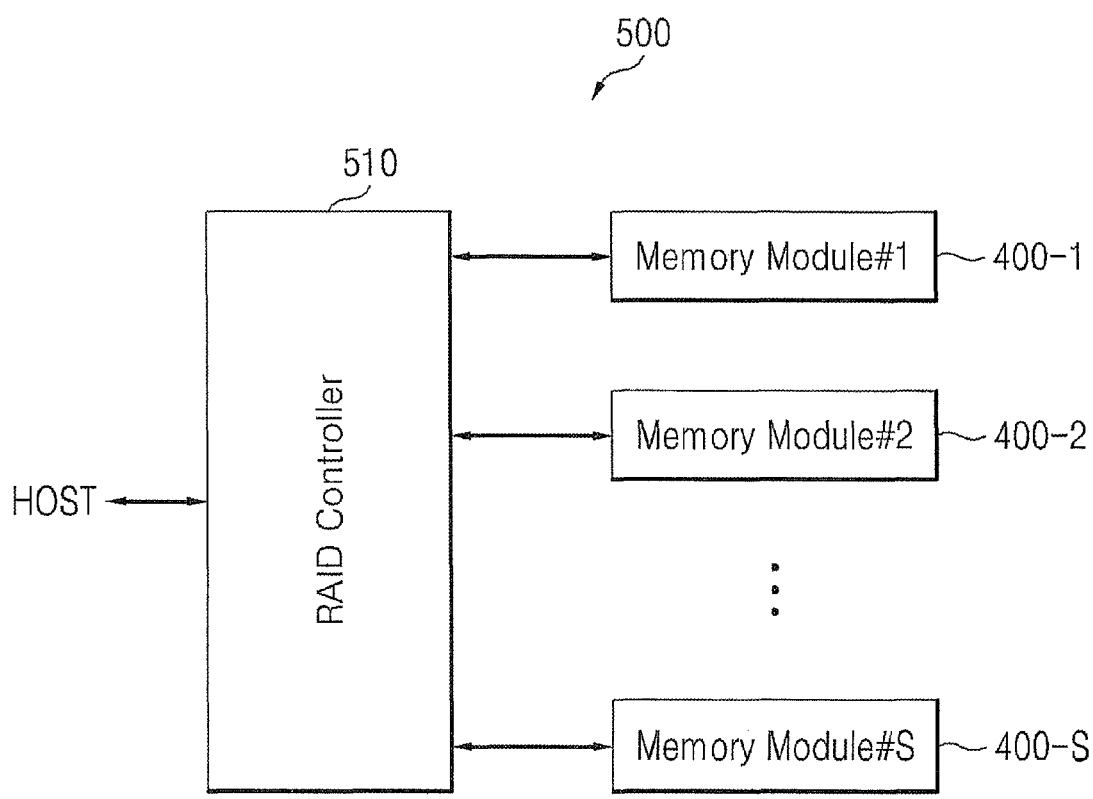

FIG. 11 is a block diagram data storage apparatuses 500 including memory systems 400 illustrated in FIG. 10. Referring to FIGS. 10 and 11, the data storage apparatus 500 may be a redundant array of independent disks (RAID) system and include a RAID controller 510 and a plurality of memory modules 400-1 through 400-S where "S" is a natural number. Each of the memory modules 400-1 through 400-S may be a memory system 400 illustrated in FIG. 10. The memory modules 400-1 through 400-S may be part of a RAID array. The data storage apparatus 500 may be or may include a personal computer (PC) and/or an SSD.

A data storage apparatus 500 which may be implemented by a redundant array of independent disks (RAID) system may include a plurality of memory modules and a RAID controller 510. The plurality of memory modules may form a redundant array of independent disks (RAID) array. Each of the memory modules 400-1 through 400-S may include a plurality of the non-volatile memory devices 120 and a memory controller 410 that may control the operation of the non-volatile memory devices 120. The RAID controller 510 may control the operation of the memory modules 400-1 through 400-S.

In a write and/or program operation, the RAID controller 510 may output write and/or program data received from a host to one of the memory modules 400-1 through 400-S according to one RAID level selected from among a plurality of RAID levels based on RAID level information in response to a write and/or program command received from the host HOST. In a read operation, the RAID controller 510 may output to the host data read from one of the modules 400-1 through 400-S according to one RAID level selected from among a plurality of RAID levels based on RAID level information in response to a read command received from the host.

As described above, according to at least one example embodiment of the inventive concepts, address scheduling methods for a 3D memory cell array may increase the operating performance of a memory device. Example embodiments of the inventive concepts may be embodied as hardware, software or combination thereof. Example embodiments of the inventive concepts may be embodied as computer-readable codes on a computer-readable medium. The computer-readable recording medium may be any data storage device that can store data as a program which can be thereafter read by a computer system. Examples of the computer-readable recording medium may include read-only memory (ROM), random-access memory (RAM), CD-ROMs, magnetic tapes, floppy disks, and/or optical data storage devices. The computer-readable recording medium can also be distributed over network coupled computer systems so that the computer-readable code is stored and executed in a distributed fashion.

While example embodiments have been particularly shown and described, it will be understood by one of ordinary skill in the art that variations in form and detail may be made therein without departing from the spirit and scope of the claims.

What is claimed is:

1. A method of programming a three dimensional non-volatile memory device including a plurality of cell strings, the plurality of cell strings including a first cell string and a second cell string, each of the plurality of cell strings including a plurality of serially-connected nonvolatile memory cells, the first cell string including a first memory cell and a third memory cell among the plurality of serially-connected nonvolatile memory cells in the first cell string, the second cell string including a second memory cell and a fourth memory cell among the plurality of serially-connected nonvolatile memory cells in the second cell string, each memory cell of the plurality of serially-connected nonvolatile memory cells in the first cell string being a multi-bit memory cell that is configured to store at least 2-bit data, each memory cell of the plurality of serially-connected nonvolatile memory cells in the second cell string being a multi-bit memory cell that is configured to store at least 2-bit data, the method comprising:

programming, sequentially or simultaneously, first and second bits of first 2-bit data into the first memory cell;

after the programming the first and second bits of the first 2-bit data into the first memory cell, programming, sequentially or simultaneously, first and second bits of second 2-bit data into the second memory cell; and after the programming the first and second bits of the second 2-bit data into the second memory cell, programming, sequentially or simultaneously, first and second bits of third 2-bit data into the third memory cell, wherein the first memory cell and the second memory cell are connected to a first word line, the third memory cell and the fourth memory cell are connected to a second word line, the plurality of serially-connected nonvolatile memory cells of each of the plurality of cell strings are stacked on or above a substrate in a first direction that is perpendicular to the substrate, and the first cell string and the second cell string are connected to a first bit line, wherein, the plurality of cell strings include a third cell string and a fourth cell string, the third cell string and the fourth cell string are connected to a second bit line, a fifth memory cell among the plurality of serially-connected nonvolatile memory cells in the third cell string and a sixth memory cell among the plurality of serially-connected nonvolatile memory cells in the fourth cell string are connected to the first word line, a seventh memory cell among the plurality of serially-connected nonvolatile memory cells in the third cell string and an eighth memory cell among the plurality of serially-connected nonvolatile memory cells in the fourth cell string are connected to the second word line, a first string selection transistor (SST) in the first cell string and a third SST in the third cell string are connected to a first string selection line (SSL), a second SST in the second cell string and a fourth SST in the fourth cell string are connected to a second SSL, and the first memory cell and the fifth memory cell are programmed concurrently.

2. The method of claim 1, wherein a distance between the third memory cell and the substrate is greater than a distance between the first memory cell and the substrate.

3. The method of claim 1, wherein the first cell string includes a string selection transistor directly connected to the first bit line, and the string selection transistor is the same type with the first memory cell.

4. The method of claim 3, wherein the first cell string includes a ground selection transistor directly connected to a source line, and the ground selection transistor is the same type with the first memory cell.

5. The method of claim 3, wherein the first cell string includes a first ground selection transistor (GST) directly connected to a source line, the second cell string includes a second GST directly connected to the source line, and the first GST is connected to a first ground selection line (GSL) and the second GST is connected to a second GSL.

6. The method of claim 1, wherein a first plurality of cell strings including the first cell string and the second cell string are connected to the first bit line and to the first word line, the first plurality of cell strings being included in the plurality of cell strings, the first plurality of cell strings being all of cell strings that are connected both to the first bit line and to the first word line, a first plurality of memory cells including the first memory cell and the second memory cell are connected to the first word line, the first plurality of memory cells being included in the first plurality of cell strings, and all of the first plurality of memory cells are programmed before the third memory cell is programmed with the third 2-bit data.

7. The method of claim 1, wherein the first bit line is connected to a first page buffer and the second bit line is connected to a second page buffer.

8. The method of claim 1 further comprising:

receiving write data, wherein the first 2-bit data, the second 2-bit data and the third 2-bit data are each data of the received write data.

9. A method of programming a three dimensional non-volatile memory device including a plurality of cell strings, the plurality of cell strings including a first cell string and a second cell string, each of the plurality of cell strings including a plurality of serially-connected nonvolatile memory cells, the first cell string including a first memory cell and a third memory cell among the plurality of serially-connected nonvolatile memory cells in the first cell string, the second cell string including a second memory cell and a fourth memory cell among the plurality of serially-connected nonvolatile memory cells in the second cell string, each memory cell of the plurality of serially-connected nonvolatile memory cells in the first cell string being a multi-bit memory cell that is configured to store at least 2-bit data, each memory cell of the plurality of serially-connected nonvolatile memory cells in the second cell string being a multi-bit memory cell that is configured to store at least 2-bit data, the method comprising:

programming the first memory cell with first 2-bit data;

after the programming the first memory cell with the first 2-bit data, programming the second memory cell with second 2-bit data; and after the programming the second memory cell with the second 2-bit data, programming the third memory cell with third 2-bit data, wherein the first memory cell and the second memory cell are connected to a first word line, the third memory cell and the fourth memory cell are connected to a second word line, the plurality of serially-connected nonvolatile memory cells of each of the plurality of cell strings are stacked on or above a substrate in a first direction that is perpendicular to the substrate, the first cell string and the second cell string are connected to a first bit line, and the programming of the first memory cell, the programming of the second memory cell, and the programming of the third memory cell are carried out by only applying a bias voltage one time to each of the first and second word lines.

10. The method of claim 9, wherein a distance between the first memory cell and the substrate is less than a distance between the third memory cell and the substrate.

11. The method of claim 10, wherein the second cell string includes a fourth memory cell connected to the second word line, the plurality of cell strings include a third cell string and a fourth cell string, the third cell string and the fourth cell string are connected to a second bit line, a fifth memory cell among the plurality of serially-connected nonvolatile memory cells of the third cell string and a sixth memory cell among the plurality of serially-connected nonvolatile memory cells of the fourth cell string are connected to the first word line, a seventh memory cell among the plurality of serially-connected nonvolatile memory cells of the third cell string and an eighth memory cell among the plurality of serially-connected nonvolatile memory cells of the fourth cell string are connected to the second word line, a first string selection transistor (SST) in the first cell string and a third SST in the third cell string are connected to a first string selection line (SSL), and a second SST in the second cell string and a fourth SST in the fourth cell string are connected to a second SSL.

12. The method of claim 11, wherein at least four cell strings including the first cell string and the second cell string are connected to the first bit line, the at least four cell strings being included in the plurality of cell strings.

13. The method of claim 10, wherein the first cell string includes a first ground selection transistor (GST) directly connected to a source line, the second cell string includes a second GST directly connected to the source line, and the first GST is connected to a first ground selection line (GSL) and the second GST is connected to a second GSL.

14. The method of claim 9, wherein the first cell string includes a string selection transistor directly connected to the first bit line, and the string selection transistor is the same type with the first memory cell.

15. The method of claim 14, wherein the first cell string includes a ground selection transistor directly connected to a source line, and the ground selection transistor is the same type with the first memory cell.

* * * * *